(12) United States Patent
Van Der Heijden et al.

(10) Patent No.: US 9,947,347 B1
(45) Date of Patent: Apr. 17, 2018

(54) MAGNETIC SENSOR USING INVERSE SPIN HALL EFFECT

(71) Applicant: Western Digital Technologies, Inc., Irvine, CA (US)

(72) Inventors: Petrus Antonius Van Der Heijden, Cupertino, CA (US); Quang Le, San Jose, CA (US); Kuok San Ho, Redwood City, CA (US); Xiaoyong Liu, San Jose, CA (US); Gonçalo Marcos Baião De Albuquerque, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/385,595

(22) Filed: Dec. 20, 2016

(51) Int. Cl.
*G11B 5/37* (2006.01)
*G01R 33/07* (2006.01)
*G11B 5/127* (2006.01)

(52) U.S. Cl.
CPC ............ *G11B 5/372* (2013.01); *G01R 33/075* (2013.01); *G11B 5/1278* (2013.01)

(58) Field of Classification Search
None
See application file for complete search history.

(56) References Cited

U.S. PATENT DOCUMENTS

| 8,018,691 | B2 | 9/2011 | Gill et al. |
| 8,164,862 | B2 | 4/2012 | Zhang et al. |
| 8,295,006 | B2 | 10/2012 | Sugano et al. |
| 9,064,509 | B2* | 6/2015 | Dimitrov ............. G11B 5/3909 |
| 9,099,119 | B2 | 8/2015 | Mihajlovic et al. |
| 9,183,858 | B2 | 11/2015 | Okawa et al. |
| 9,269,381 | B1* | 2/2016 | Sapozhnikov ....... G11B 5/3912 |
| 9,281,469 | B2 | 3/2016 | Quan et al. |
| 9,412,400 | B2 | 8/2016 | Xiao et al. |
| 9,691,458 | B2* | 6/2017 | Ralph ..................... G11C 11/18 |
| 2007/0019340 | A1 | 1/2007 | Gill |
| 2009/0154030 | A1* | 6/2009 | Yamada ................. B82Y 25/00 360/319 |
| 2009/0161265 | A1* | 6/2009 | Sugano ............. G01R 33/1284 360/324 |
| 2013/0154633 | A1 | 6/2013 | Fujiwara et al. |

(Continued)

OTHER PUBLICATIONS

International Search Report and Written Opinion for PCT/US2017/051521, dated Dec. 20, 2017.

*Primary Examiner* — William J Klimowicz
(74) *Attorney, Agent, or Firm* — Foley & Lardner LLP

(57) ABSTRACT

A magnetic sensor that generates a signal based on inverse spin Hall effect. The sensor includes a magnetic free layer and a non-magnetic, electrically conductive spin Hall layer located adjacent to the magnetic free layer. Circuitry is configured to supply an electrical current that travels through the magnetic free layer and the spin Hall layer in a direction that is generally perpendicular to the plane of the layers or perpendicular to a plane defined by an interface between the magnetic free layer and the spin Hall layer. The inverse spin Hall effect causes an electrical voltage in the spin Hall layer as a result of the current, and the voltage changes relative to the orientation of magnetization of the magnetic free layer. Circuitry is provided for measuring the voltage in the spin Hall layer in a direction that is generally perpendicular to the direction of the electrical current.

28 Claims, 8 Drawing Sheets

(56) References Cited

U.S. PATENT DOCUMENTS

| | | | |
|---|---|---|---|
| 2014/0169088 A1* | 6/2014 | Buhrman | G11C 11/18 365/158 |
| 2014/0226239 A1* | 8/2014 | Mihajlovic | H01L 43/06 360/112 |
| 2015/0077883 A1* | 3/2015 | Kudo | G11B 5/314 360/324.11 |
| 2015/0170686 A1* | 6/2015 | Singleton | G11B 5/3912 360/319 |
| 2015/0200003 A1* | 7/2015 | Buhrman | G11C 11/18 365/158 |
| 2015/0287426 A1 | 10/2015 | Mihajlovic et al. | |
| 2016/0276006 A1* | 9/2016 | Ralph | G11C 11/18 |
| 2017/0178705 A1* | 6/2017 | Buhrman | G11C 11/161 |

* cited by examiner

MAGNETIC SENSOR USING INVERSE SPIN HALL EFFECT

FIELD OF THE INVENTION

The present invention relates to magnetic data recording and more particularly to a magnetic read sensor that utilizes inverse spin Hall effect to detect the presence of a magnetic field.

BACKGROUND

At the heart of many computer systems is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the reading and writing functions.

The write head includes at least one coil, a write pole and one or more return poles. When current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic media, thereby recording a bit of data. The write field then travels through a magnetically soft under-layer of the magnetic medium to return to the return pole of the write head.

Magnetoresistive sensors such as a Giant Magnetoresistive (GMR) sensors, Tunnel Junction Magnetoresistive (TMR) sensors or a scissor type magnetoresistive sensors have been employed to read a magnetic signal from the magnetic media. Such a magnetoresistive sensor has an electrical resistance that changes in response to an external magnetic field. This change in electrical resistance can be detected by processing circuitry in order to read magnetic data from the magnetic media. The sensor is located between first and second magnetic shields and the spacing between the shields effects data density. A smaller spacing between the shields results in an increase in data density by increasing the number of bits that can be recorded and detected on a given length of data track.

SUMMARY

One embodiment of the present invention provides a magnetic sensor that includes a magnetic free layer and a spin Hall layer formed of an electrically conductive, non-magnetic material formed adjacent to the magnetic free layer. Circuitry is provided that is configured to cause an electrical current to flow through the magnetic free layer and spin Hall layer in a direction that is perpendicular to the plane of the layers. Circuitry is also provided for measuring a voltage across the spin Hall layer along the plane of the spin Hall layer and in a direction that is substantially perpendicular to the direction of the electrical current.

An embodiment of the invention can include a magnetic free layer, a non-magnetic, electrically conductive layer formed adjacent to the magnetic free layer and means for generating a voltage in the non-magnetic layer as a result of inverse spin Hall effect, with the voltage being affected by the direction of magnetization of the magnetic free layer. This can be provided by the circuitry described above, which provides a means for causing a current to flow through the magnetic free layer in a direction that is perpendicular to a plane defined by the magnetic free layer.

The electrical current flowing through the magnetic free layer becomes spin polarized and will inject a spin current into the spin Hall layer in a lateral direction due to spin-accumulation. The spin current will generate a charge current and hence an electrical voltage difference in the spin Hall layer as a result of inverse spin Hall effect. This voltage varies depending upon the spin polarization of spin current which is the same as the orientation of the magnetization of the magnetic free layer. Therefore, because the magnetization of the magnetic free layer can change in response to an external magnetic field, the external magnetic field can be detected by measuring this voltage across the spin Hall layer.

The spin Hall layer can be formed of a heavy metal with strong spin-orbital coupling and larger spin Hall efficiency. The spin Hall layer can be formed of one or more of Ta, W, Pt, Hf and Bi.

While the magnetic free layer can extend from the media facing surface to a first distance that defines a stripe height, the spin Hall layer can extend further to a second distance that is longer than the first distance. For example, the spin Hall layer can extend past the first distance to a second distance, and the difference between the first and second distances can be about equal to the spin diffusion length of the material of the spin diffusion layer. For example, the difference between the first and second distances can be equal to the spin diffusion length of the material of the spin diffusion layer plus or minus 10%.

The voltage can be measured across the spin Hall layer at a location that is just beyond the stripe height defined by the magnetic free layer. Alternatively, the voltage can be measured at a location that is adjacent to the magnetic free layer at a location that is between the media facing surface and the stripe height defined by the magnetic free layer.

The spin Hall layer can be in direct contact with the magnetic free layer thereby defining an interface between the spin diffusion layer and the magnetic free layer. The spin diffusion layer can have a thickness as measured perpendicular to the interface that is about equal to the spin diffusion length of the spin Hall layer or that is equal to the spin diffusion length plus or minus 10%.

The magnetic free layer can be a magnetic layer with a thickness that is greater than the spin-diffusion length of magnetic free layer. A material of high spin—polarization and shorter spin diffusion is preferred, such as a Heusler based alloy. The free layer can also be a structure that includes first and second magnetic layers that are anti-parallel coupled across a non-magnetic layer such as Ru located between the magnetic layers. Alternatively, the magnetic free layer can be a first magnetic layer located at a first side of the spin Hall layer and a second magnetic free layer can be located at an opposite side of the spin Hall layer.

Such a magnetic sensor greatly reduces gap thickness by eliminating the need for a magnetic pinned layer or for a pinning layer such as an antiferromagnetic (AFM) layer, and even eliminates the need for a non-magnetic spacer or barrier layer. In addition, the sensor advantageously makes the electrical current (used to cause the inverse spin Hall effect) independent of the voltage measured across the spin Hall layer. This allows both the current and the voltage to be optimized as needed independently of one another.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
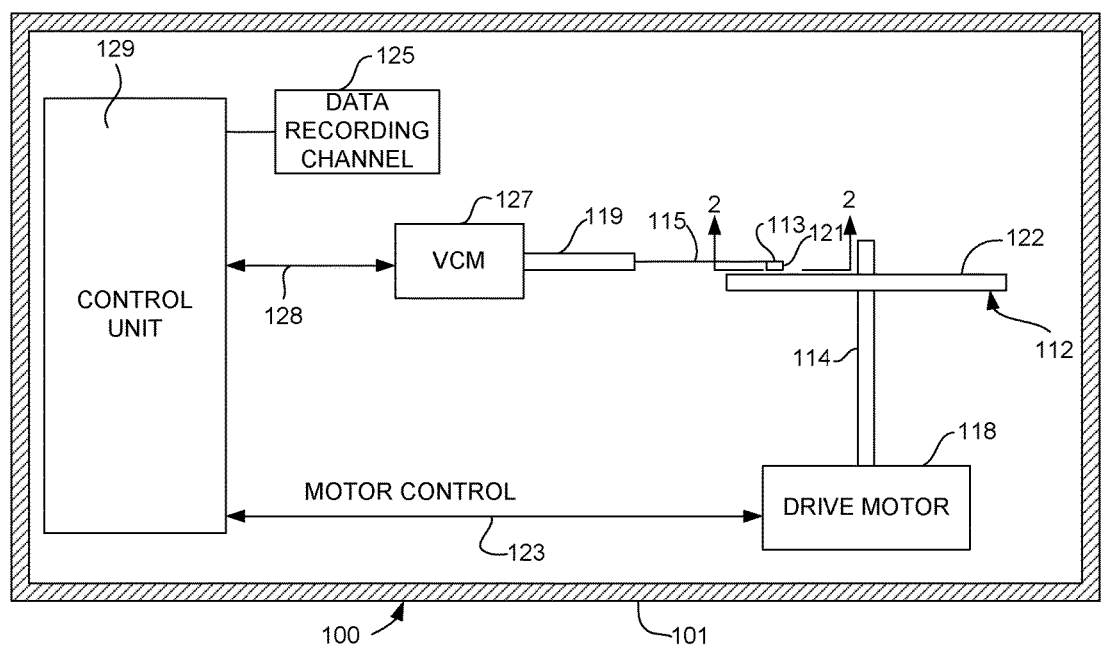
FIG. 1 is a schematic illustration of a disk drive system in which the invention might be embodied.

Referring now to FIG. 1, there is shown a disk drive/data storage system 100. The disk drive 100 includes a housing 101. At least one rotatable magnetic disk 112 is supported on a spindle 114 and rotated by a disk drive motor 118. The magnetic recording on each disk may be in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by the control unit 129.

During operation of the disk storage system, the rotation of the magnetic disk 112 generates an air bearing between the slider 113 and the disk surface 122, which exerts an upward force or lift on the slider. The air bearing thus counter-balances the slight spring force of the suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the media 112. Write and read signals are communicated to and from write and read heads 121 by way of recording channel 125.

Figure 2:
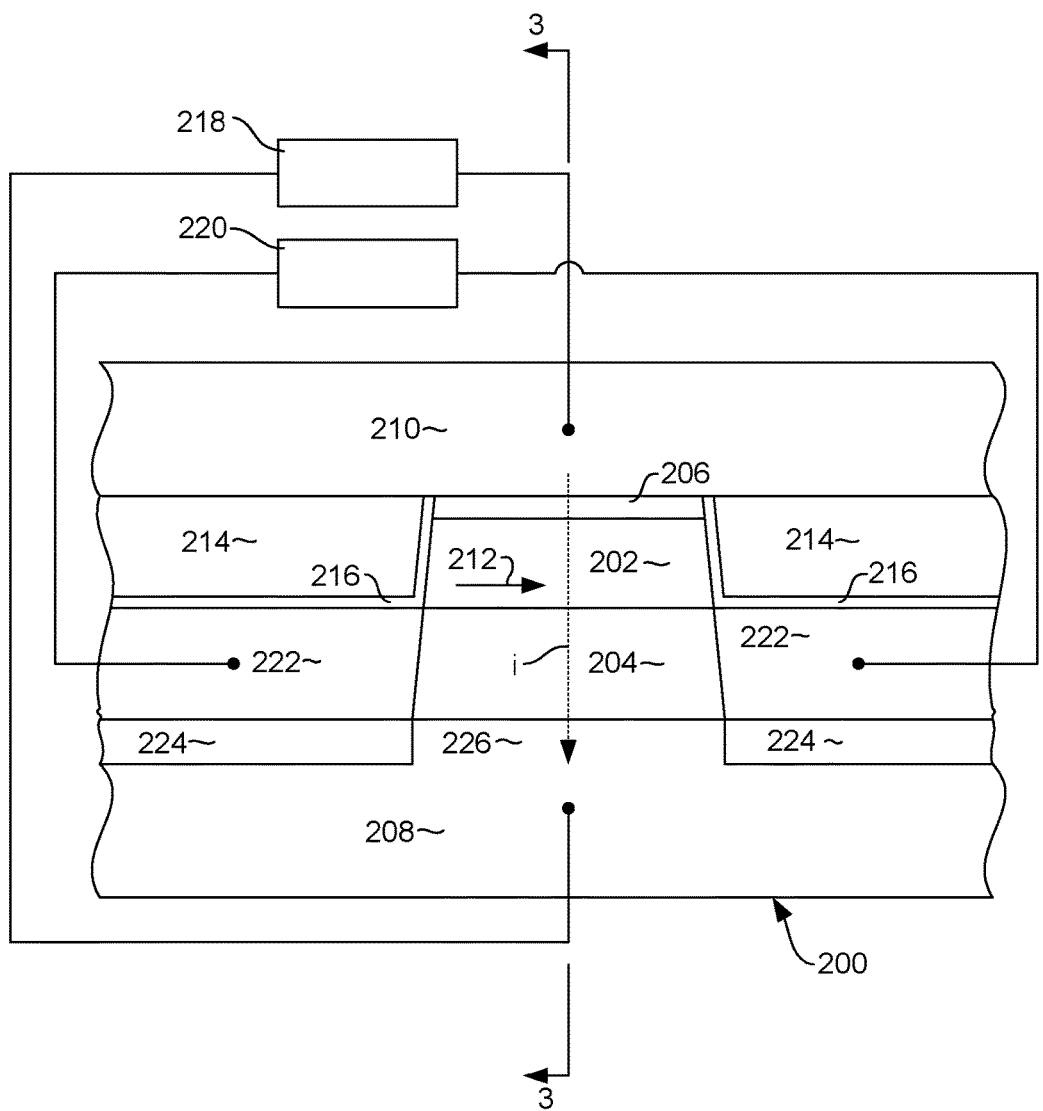
FIG. 2 is a view of a magnetic sensor according to one embodiment as viewed from a media facing surface.

FIG. 2 shows a magnetic sensor 200 according to one possible embodiment as viewed from a media facing surface. The sensor can include a magnetic free layer 202 and a non-magnetic spin Hall layer 204 formed adjacent to the magnetic free layer 202. A capping layer 206 can be formed over the magnetic free layer 202. The magnetic free layer 202, spin Hall layer 204 and capping layer 206 can be located between first and second magnetic shields 208, 210. The distance between the magnetic shields 208, 210 defines the gap spacing. In order to maximize data density it is desirable to make the gap spacing as small as possible. This is because a smaller gap spacing allows the sensor to read a magnetic signal with small bit length along data tracks, thereby allowing the sensor to read more bits per inch of data track.

The magnetic free layer 202 can be constructed of a magnetic material such as one or more layers of Co—Fe, Co—Fe—B or a Heusler alloy. The thickness of magnetic free layer is preferably thicker than spin diffusion length of free layer in order to fully polarize current and increase spin current injection into spin Hall layer 204. The spin Hall layer 204 can be constructed of a non-magnetic metal, which preferably has a large spin-orbital coupling. The spin diffusion layer 204 is preferably constructed of a heavy metal such as Ta, W, Pt, Hf, Bi or alloys thereof. The capping layer 206 can be formed of a material such as Ta and or Ru or Rh.

The magnetic free layer 202 has a magnetization that is generally oriented in a direction parallel with the media facing surface as indicated by arrow 212, but which is free to move its orientation in response to an external magnetic field. Biasing for the free layer can be provided by permanent magnetic bias layers 214 that can be located at either side of the magnetic free layer 202 and that can be electrically separated from top shield layer 210 or by similarly located soft magnetic side shields which can be directly in contact with the top shield layer 210. Each of the magnetic bias layers 214 can be separated from the magnetic free layer 202 and from the spin Hall layer 204 by a non-magnetic, electrically insulating layer 216. Other biasing mechanisms are also possible, such as back edge bias structures, in plane bias structures, etc.

With continued reference to FIG. 2, circuitry 218 can be provided to supply an electrical current i through the sensor that is oriented in a direction that is perpendicular to the planes of the layers 204, 202, 206. In other words, the circuitry applies the current i in a direction that is generally parallel with the direction of a data track to be read by the sensor. The circuitry 218 provides one example of a means for generating a voltage in the spin hall layer 204 as a result of inverse spin Hall effect, as will be explained in greater detail herein below.

Because of the magnetization of the free layer 202, electrons traveling though the magnetic free layer 202 will become spin polarized. The orientation of spin polarization will be affected by the direction of the magnetization of the magnetic free layer 202. Therefore, as the magnetization of the magnetic free layer 202 changes in response to a magnetic field, the orientation of the spin polarization will change as well.

When these spin polarized electrons travel through the interface between the free-layer 202 and the spin Hall layer 204, due to spin accumulation at the interface, there will be a spin current induced and injected in to the spin Hall layer 204 as a result of spin accumulation at the interface between the free layer 202 and the spin Hall layer 204. Such a spin current can generate a voltage inside spin Hall layer 204 as a result of inverse spin Hall effect. This voltage will be oriented parallel to the plane defined by the interface between the spin Hall layer 204 and the magnetic free layer 202. This voltage can be oriented in a direction that is perpendicular to the direction of flow of the current i from top to the bottom or vice versa in FIG. 2 and also perpendicular to the spin polarization direction of magnetic free layer.

Circuitry 220 can be provided for measuring this voltage. The voltage generated by the Inverse Spin Hall Effect will change based on the relative orientation of the magnetization 212 of the magnetic free layer 202 across the track width direction. By detecting a change in the voltage, the circuitry 220 can, thereby, detect the presence of an external magnetic field such as from an adjacent magnetic media. The circuitry 220 can be connected with leads 222 formed at either side of the spin Hall layer 204. The leads 222, which will be discussed in greater detail herein below, can be integral with the spin Hall layer 204 (being formed of the same material and even in the same patterning process) or could also be separate structures formed of an electrically conductive material that is different from the material of the spin Hall layer 204.

As shown in FIG. 2, electrically insulating layers 224 can be provided between the leads 222 and the adjacent shield 208, leaving the shield 208 electrically connected with the spin Hall layer 204 in the sensor area so as to prevent the current i from being shunted from the leads 222 to the shield 208. This can be accomplished by forming an upwardly extending, electrically conductive portion 226 at the top of the shield 208 between the electrically insulating layers 224. This portion 226 can be formed of the shield material 208, or can be a separately formed feature and can be self aligned with the layer 204 in a common masking and ion milling process.

Figure 3:
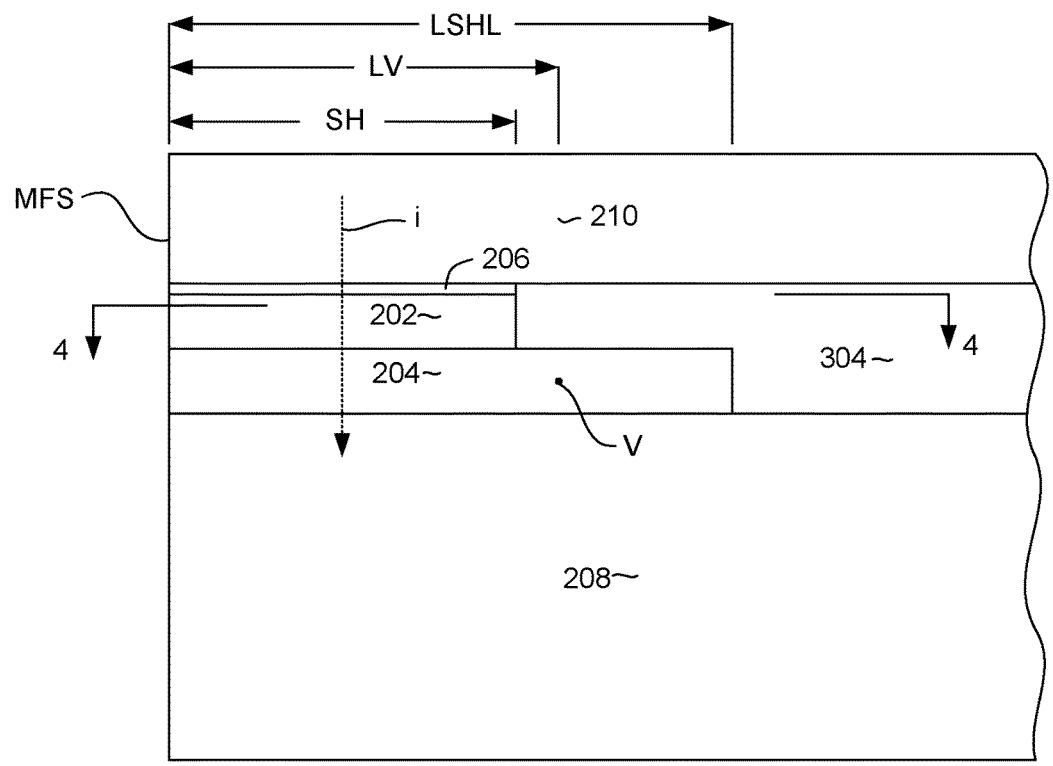
FIG. 3 is a side, cross sectional view of the sensor of FIG. 2 as taken from line 3-3 of FIG. 2.
Figure 4:
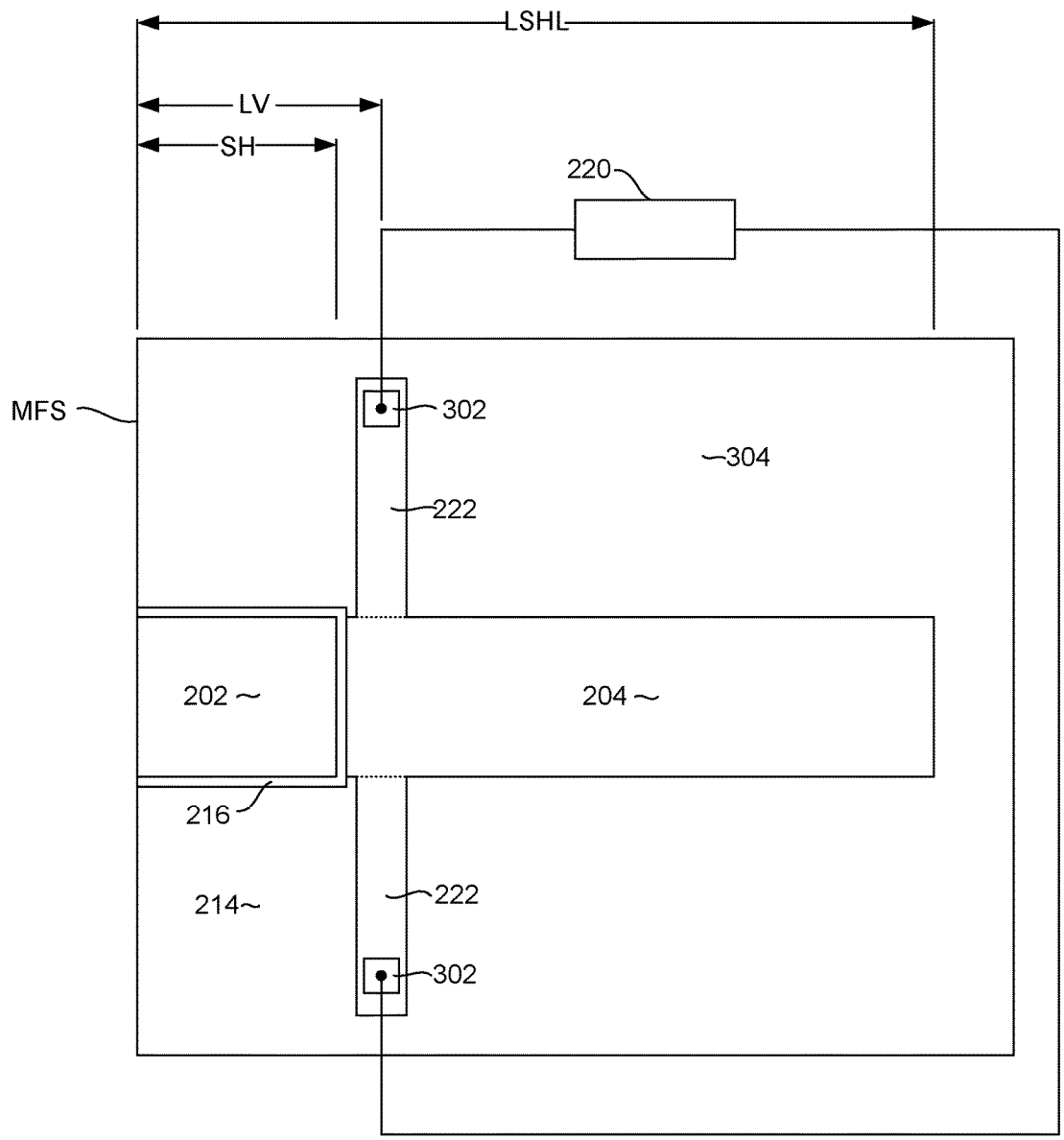
FIG. 4 is a top down sectional view of a magnetic sensor according to one possible embodiment as seen from line 4-4 of FIG. 3.

FIG. 3 is a side cross-sectional view as seen from line 3-3 of FIG. 2, and FIG. 4 is a top-down sectional view as seen from line 4-4 of FIG. 3. With reference to FIG. 3, it can be seen that the magnetic free layer 202 extends from the media facing surface MFS to a distance SH, which defines the stripe height of the sensor. On the other hand, the spin Hall layer 204 can extend further from the media facing surface to a second distance LSHL. Preferably, the distance between LSHL and SH is about equal to the spin diffusion length of the material of the spin Hall layer 204. For example, the spin Hall layer 204 can extend beyond the stripe height distance SH by a distance that is equal to the spin diffusion length of the spin Hall layer 204 plus or minus 10%. The voltage measurement (designated by dot V in FIG. 3) can be measured across the spin Hall layer at a location that is at a distance LV as measured from the media facing surface MFS. The distance LV can be slightly larger than the stripe height SH, so that the voltage can be measured at a location that is just slightly beyond the back edge of the magnetic free layer 202.

This can be seen more clearly with reference to FIG. 4, which shows a top down sectional view of the magnetic free layer 202 and the spin Hall layer 204. In FIG. 4 it can be seen that the leads 222 can be formed at either side of the spin Hall layer 204 and can be located at a location that is just beyond the back edge of the magnetic free layer 202. As discussed above, the leads 222 can be formed of the same material as the spin Hall layer 204 and can be formed in the same patterning step as the spin Hall layer. Or, alternatively, the leads 222 can be formed of a different electrically conductive material such as Cu or Au. At or near the end of each of the leads 222, vias 302 can be formed to allow electrical connection between the circuitry 220 and the leads 222. The space beyond the back of the free layer 202 and spin Hall layer 204 can be filled with an electrically insulating fill layer such as alumina, MgO, SiN or $Ta_2O_5$ 304.

Placing the electrical leads 222 slightly behind the back edge of the magnetic free layers facilitates electrical connection with the leads 222 while avoiding interference with the magnetic bias structures 214 (FIG. 2). However, moving the leads 222 further from the magnetic free layer 202 decreases performance of the sensor 200. The further the leads 222 are from the free layer 202, the more the performance of the sensor will suffer. In one embodiment, we can put the electrical leads 222 directly underneath magnetic free layer 202 as will be described further herein below. It should also be pointed out that, while FIGS. 2, 3 and 4 show the magnetic free layer 202 being above the spin Hall layer 204, this by way of example. The magnetic free layer 202 could also be beneath the spin Hall layer 204.

The space between the magnetic shields 208, 210 defines the read gap, and reducing the read gap is desirable for increasing data density along data track in a magnetic data recording system. The above described magnetic sensor 200 greatly decreases the read gap by eliminating the need for a magnetic pinned layer and also eliminating the need for a pinning structure such as a layer of antiferromagnetic material (AFM layer) and also eliminating the need for a spacer or barrier layer between such a free layer and pinned layer structure. In more traditional magnetic sensor designs, the pinned layer is pinned by a layer of antiferromagnetic material and this layer must be significantly thick to perform its function as a pinning mechanism. Therefore, in a traditional magnetic sensor these layers (pinning layer, pinned layer and spacer or barrier layer) require a great deal of thickness to function properly and, therefore, greatly limit the amount by which the read gap can be reduced. The sensor 200 described above provides a novel approach for generating a magnetic signal, which allows for greatly reduced gap spacing as compared with other more conventional sensors such as giant magnetoresistive sensors or tunnel junction sensors, both of which require thick pinned magnetic layer structures, magnetic pinning structures (such as a thick antiferromagnetic layer) and spacer or barrier layer structures.

Figure 5:
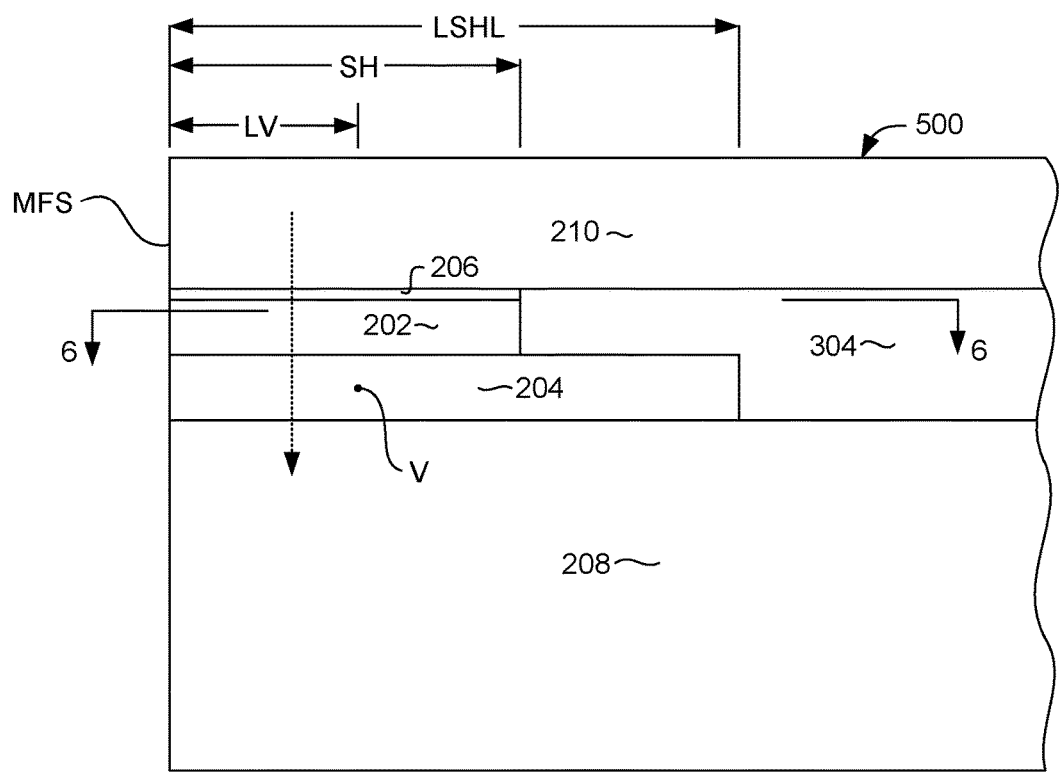
FIG. 5 is a side, cross sectional view of a magnetic sensor according to another possible embodiment.
Figure 6:
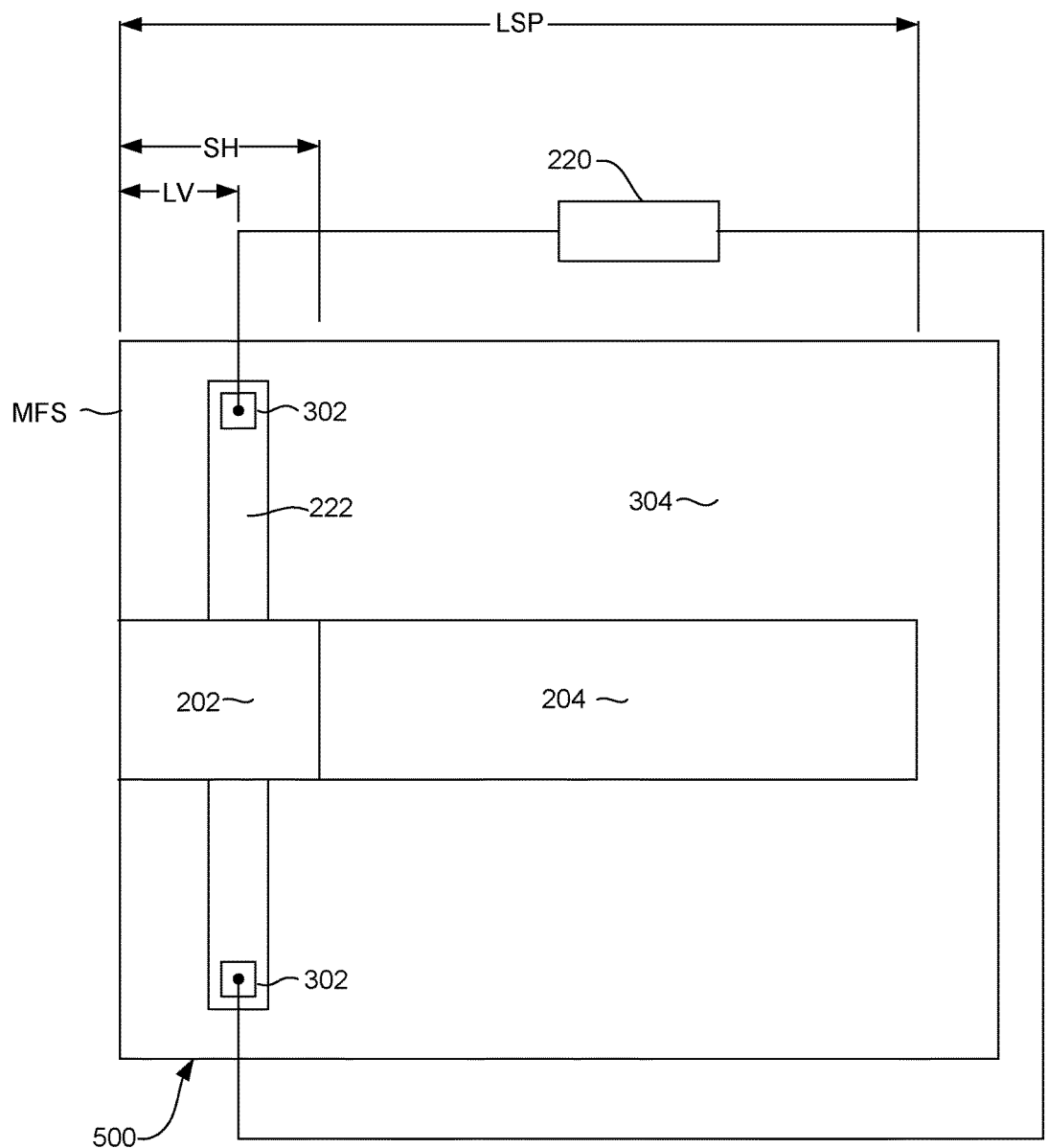
FIG. 6 is a top down sectional view of the sensor of FIG. 5 as seen from line 6-6 of FIG. 5.

With reference to FIGS. 5 and 6, in a sensor 500 according to another possible embodiment, the voltage can be measured at a location (designated as V in FIG. 5) that is directly in the region of the magnetic free layer 202. This can be accomplished by locating the leads 222 in a region that is between the media facing surface MFS and the stripe height SH as shown. In this case, LV can be smaller than or equal to SH. This configuration may maximize the performance of the sensor so long as care is taken not to interfere with the presence of the magnetic bias layers 214 and insulation layer 216 (FIG. 2). For example an in stack bias structure (not shown) could be used to bias the magnetic free layer 202, or a back edge bias structure (also not shown) could be used to bias the magnetic free layer 202. Again, it should be pointed out that, while the magnetic free layer 202 is shown as being above the spin Hall layer 204 in FIGS. 5 and 6, this is by way of example only. The magnetic free layer 202 could also be beneath the spin Hall layer 204.

Figure 7:
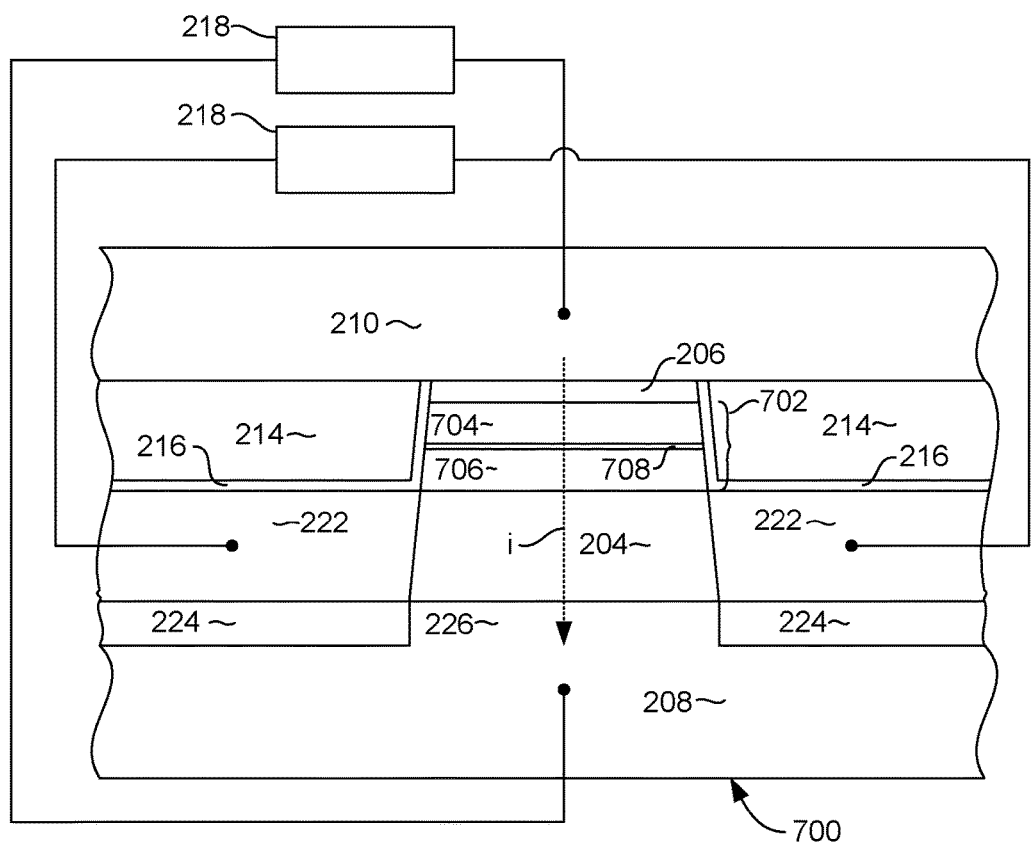
FIG. 7 is a view of a magnetic sensor according to another embodiment as viewed from a media facing surface.

FIG. 7 shows a view of a magnetic sensor according to another possible embodiment. The sensor 700 includes an anti-parallel coupled free layer structure 702 that includes first and second magnetic layers 704, 706 that are anti-parallel coupled with one another by a thin, non-magnetic antiparallel coupling layer such as Ru 708 located between the magnetic layers 704, 706. The thickness of the anti-parallel coupling layer 708 is chosen so as to cause the magnetizations of the first and second magnetic layers 704, 706 to orient themselves in directions that are generally opposite (anti-parallel) to one another. This sensor functions as a differential sensor to detect magnetic fields in the bit transition region, and as with the previously described embodiment the response is via in plane voltage induced from Inverse Spin Hall Effect. As with the above described embodiments, the magnetic layers 704, 706 could be constructed of various magnetic materials such as one or more of Co—Fe, Ni—Fe and/or a Heusler alloy. Again it should be pointed out that, while the magnetic free layer structure 702 is shown being above the spin Hall layer, this is by way of example. The magnetic free layer structure 702 could also be beneath the spin Hall layer 204.

Figure 8:
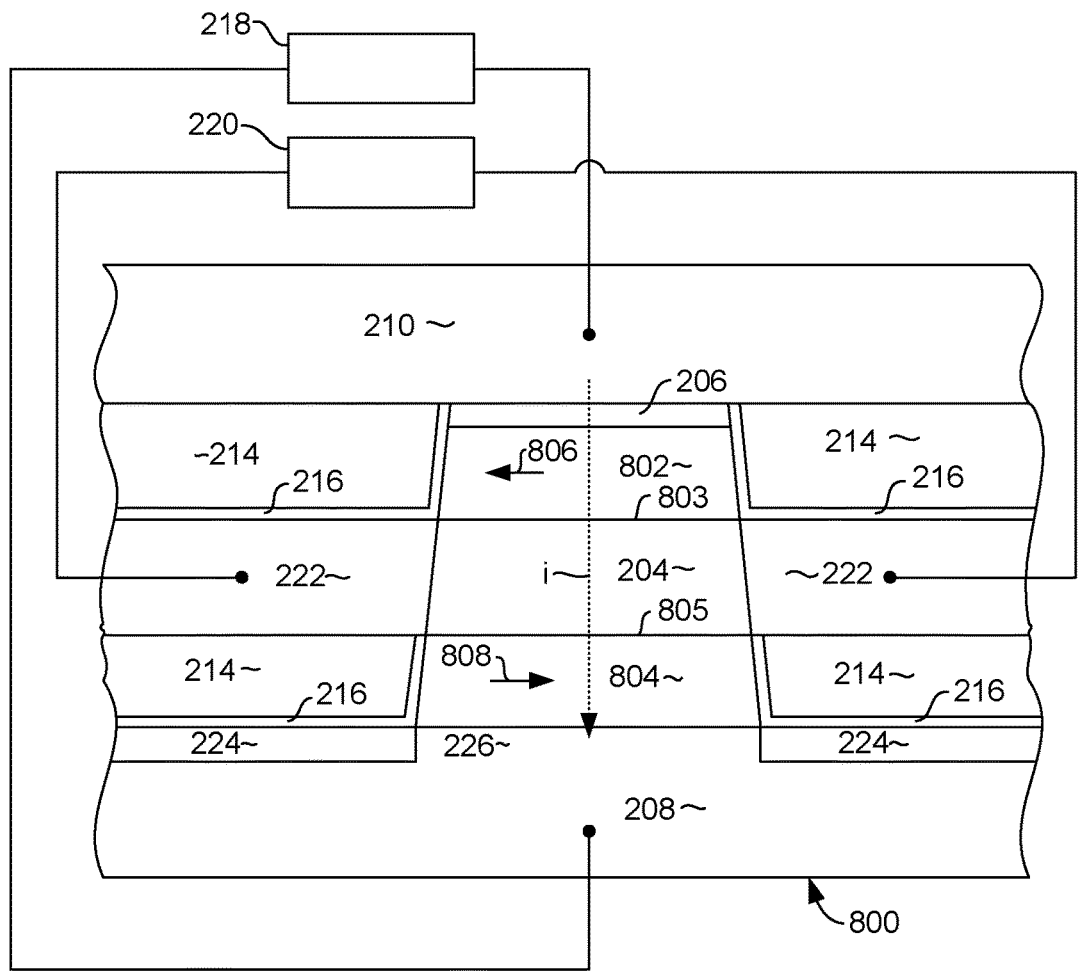
FIG. 8 is a view of a magnetic sensor according to another embodiment as viewed from the media facing surface.

FIG. 8 shows a magnetic sensor 800 according to yet another possible embodiment. The sensor 800 can have first and second magnetic free layer structures 802, 804 located at opposite sides of the spin Hall layer 204. In other words, the spin Hall layer 204 can be located directly between the first and second magnetic free layers 802, 804. This results in a first interface 803 between the free layer 802 and the spin Hall layer 204 and a second interface 805 between the second magnetic free layer 804 and the spin Hall layer 204. This configuration essentially doubles the spin current and therefore doubles output voltage. However, as can be seen, increase in signal output may come at a cost of increasing the read gap as a result of the space occupied by the second magnetic free layer. Each of the magnetic free layers 802, 804 can be biased by magnetic bias structure 214. The biasing provided by the bias structures 214 can be such that the magnetic free layers 802, 804 have their magnetizations biased in opposite directions parallel with the media facing surface as indicated by arrows 806, 808. This will cause the direct spin injection into spin Hall layer through transmission at first interface 803 and reflection at second interface 805 to have the same direction of polarizations for maximum signal output. Again, the magnetic free layers 802, 804 can be constructed of one or more magnetic materials such as one or more of Co—Fe, Ni—Fe or a Heusler alloy.

As can be seen, all of the above described embodiments provide the ability to greatly reduce read gap thickness and thereby improve resolution by eliminating the need for a pinned layer structure, pinning structure such as a layer of antiferromagnetic material, and spacer or barrier layer. In addition, a reader sensor based on the inverse spin Hall effect such as described above with regard to the various possible embodiments provides an additional advantage in that the current used to generate the inverse spin Hall effect is perpendicular to the voltage used to read the signal. By contrast, in a more conventional sensor such as a tunnel junction sensor, a sense current is supplied through the sensor layers, for example between the upper and lower shields, and the voltage is measured across the same path between the shields. By contrast, in sensors such as those described above, the current and voltage are along different paths, independent of one another. The voltage can then be measured independently of the current in a direction that is not affected by this current.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic sensor, comprising:
   a magnetic free layer;
   a spin Hall layer formed of an electrically conductive, non-magnetic material formed adjacent to the magnetic free layer, wherein the magnetic free layer extends from a media facing surface to a first distance that defines a stripe height, and wherein the spin Hall layer extends from the media facing surface to a second distance that is greater than the first distance;
   circuitry configured to cause an electrical current to flow through the magnetic free layer and the spin Hall layer in a direction that is perpendicular to the plane of the layers; and
   circuitry for measuring a voltage across the spin Hall layer in a direction that is substantially perpendicular to the direction of the electrical current.

2. The magnetic sensor as in claim 1, wherein the electrical current flowing through the magnetic free layer and the spin Hall layer results in an electrical voltage in the spin Hall layer as a result of inverse spin Hall effect.

3. The magnetic sensor as in claim 1, wherein the spin Hall layer is constructed of a heavy metal.

4. The magnetic sensor as in claim 1, wherein the spin Hall layer comprises one or more of: Ta, W, Pt, Hf and Bi.

5. The magnetic sensor as in claim 1, wherein the spin Hall layer is formed of a material having a spin diffusion length, and wherein the difference between the first and second distances is substantially equal to the spin diffusion length of spin Hall layer.

6. The magnetic sensor as in claim 1, wherein the spin Hall layer is formed of a material having a spin diffusion length and wherein the difference between the first and second distances is equal to the spin diffusion length plus or minus 10%.

7. The magnetic sensor as in claim 1, wherein the spin Hall layer is in direct contact with the magnetic free layer.

8. The magnetic sensor as in claim 1, wherein:
   the spin Hall layer is in direct contact with the magnetic free layer, defining an interface between the spin Hall layer and the magnetic free layer;
   the spin Hall layer comprises a material having a spin diffusion length; and
   the spin Hall layer has a thickness measured perpendicular to the interface that is substantially equal to the spin diffusion length.

9. The magnetic sensor as in claim 1, wherein:
the spin Hall layer is in direct contact with the magnetic free layer, defining an interface between the spin Hall layer and the magnetic free layer;
the spin Hall layer comprises a material having a spin diffusion length; and
the spin Hall layer has a thickness measured perpendicular to the interface that is equal to the spin diffusion length plus or minus 10%.

10. The magnetic sensor as in claim 1, wherein the voltage is measured in a region beyond the stripe height.

11. The magnetic sensor as in claim 1, wherein the voltage is measured in a region that is just slightly beyond the stripe height.

12. The magnetic sensor as in claim 1, wherein the voltage is measured in a region that is between the media facing surface and the stripe height.

13. The magnetic sensor as in claim 1, wherein the magnetic free layer is a single magnetic layer.

14. The magnetic sensor as in claim 1, wherein the magnetic free layer is a structure that includes first and second magnetic layers that are antiparallel coupled by a non-magnetic layer located between the first and second magnetic layers.

15. The magnetic sensor as in claim 1, wherein the magnetic free layer is a first magnetic free layer located at a first side of the spin Hall layer, the sensor further comprising a second magnetic free layer located at a second side of the spin Hall layer that is opposite to the first side of the spin Hall layer.

16. The magnetic sensor as in claim 1, wherein the spin Hall layer comprises a material having a strong spin orbit coupling effect.

17. A magnetic data recording system, comprising:
a housing;
a magnetic media mounted within the housing;
an actuator;
a slider connected with the actuator for movement adjacent to the magnetic media; and
a magnetic sensor formed on the slider, the magnetic sensor comprising a magnetic free layer, and a spin Hall layer formed of an electrically conductive, non-magnetic material formed adjacent to and directly in contact with the magnetic free layer, wherein the magnetic free layer extends from a media facing surface to a first distance that defines a stripe height, and wherein the spin Hall layer extends from the media facing surface to a second distance that is greater than the first distance;
circuitry configured to cause an electrical current to flow through the magnetic free layer and the spin Hall layer in a direction that is perpendicular to the plane of the layers; and
circuitry for measuring a voltage across the spin Hall layer in a direction that is substantially perpendicular to the direction of the electrical current.

18. The magnetic data recording system as in claim 17, wherein the electrical current flowing through the magnetic free layer and the spin Hall layer results in an electrical voltage in the spin Hall layer as a result of inverse spin Hall effect.

19. The magnetic data recording system as in claim 17, wherein the spin Hall layer comprises one or more of: Ta, W, Pt, Hf and Bi.

20. A magnetic sensor, comprising:
a magnetic free layer;
a spin Hall layer formed of a non-magnetic, electrically conductive layer formed adjacent to magnetic free layer, wherein the magnetic free layer extends from a media facing surface to a first distance and the non-magnetic, electrically conductive layer extends from the media facing surface to a second distance that is greater than the first distance; and
means for generating a voltage in the non-magnetic layer as a result of inverse spin Hall effect, the voltage being effected by a direction magnetization of the magnetic free layer.

21. The magnetic sensor as in claim 20, further comprising means for causing a current to flow through the magnetic free layer in a direction that is perpendicular to a plane defined by the magnetic free layer.

22. The magnetic sensor as in claim 21, further comprising means for detecting the voltage in the non-magnetic, electrically conductive layer.

23. The magnetic sensor as in claim 21, wherein the voltage is measured in a direction that is perpendicular to the direction of current flow.

24. The magnetic sensor as in claim 20, wherein the non-magnetic, electrically conductive layer is a heavy metal.

25. The magnetic sensor as in claim 20, wherein the non-magnetic, electrically conductive layer comprises one or more of Ta, W, Pt, Hf and Bi.

26. The magnetic sensor as in claim 20, wherein the non-magnetic, electrically conductive layer has a spin diffusion length and wherein the second distance is greater than the first distance by an amount that is about equal to the spin diffusion length of the non-magnetic, electrically conductive layer.

27. The magnetic sensor as in claim 20, wherein the non-magnetic, electrically conductive layer has a spin diffusion length and wherein the second distance is greater than the first distance by an amount that is equal to the spin diffusion length of the non-magnetic, electrically conductive layer plus or minus 10%.

28. The magnetic sensor as in claim 20, wherein
the magnetic free layer is in contact with the non-magnetic, electrically conductive layer thereby defining an interface between the magnetic free layer and the non-magnetic, electrically conductive layer;
the non-magnetic, electrically conductive layer comprises a material having a spin diffusion length; and
the non-magnetic, electrically conductive layer has a thickness measured perpendicular to the interface that is equal to the spin diffusion length of the non-magnetic, electrically conductive layer plus or minus 10%.

* * * * *